United States Patent
Gomi

[11] Patent Number: 6,008,524
[45] Date of Patent: *Dec. 28, 1999

[54] INTEGRATED INJECTION LOGIC SEMICONDUCTOR DEVICE

[75] Inventor: Takayuki Gomi, Tokyo, Japan

[73] Assignee: Sony Corporation, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/647,771

[22] Filed: May 15, 1996

[30] Foreign Application Priority Data

May 19, 1995 [JP] Japan .................................. 7-121887

[51] Int. Cl.$^6$ ...................... H01L 27/082; H01L 27/102; H01L 29/70; H01L 31/11

[52] U.S. Cl. ........................ 257/575; 257/566; 257/574; 257/576; 438/205

[58] Field of Search ................................... 257/348, 355, 257/530, 566, 574–576; 438/205

[56] References Cited

U.S. PATENT DOCUMENTS

| | | | |
|---|---|---|---|
| 4,326,135 | 4/1982 | Jarrett et al. ............................. | 327/65 |
| 4,338,622 | 7/1982 | Feth et al. ............................... | 257/576 |
| 4,385,433 | 5/1983 | Ozawa .................................. | 29/576 B |
| 4,512,075 | 4/1985 | Vora ..................................... | 29/577 |
| 4,539,742 | 9/1985 | Kanzaki et al. ......................... | 29/576 |
| 5,280,190 | 1/1994 | Lu ........................................ | 257/587 |
| 5,682,059 | 10/1997 | Yoshii et al. ........................... | 257/530 |

FOREIGN PATENT DOCUMENTS

| | | |
|---|---|---|
| 0 021 403 | 7/1981 | European Pat. Off. . |
| 0 297 335 | 4/1989 | European Pat. Off. . |

OTHER PUBLICATIONS

Ning, Tak H., "The Potential of Bipolar Devices for VLSI", Symp. of VLSITECH, Invited Paper, pp. 34–35, Dec. 1981.

*Primary Examiner*—Mahshid Saadat
*Assistant Examiner*—Allan R. Wilson
*Attorney, Agent, or Firm*—Rader, Fishman & Grauer; Ronald P. Kananen

[57] ABSTRACT

A logic circuit is formed of an $I^2L$ cell structure in which a difference of switching speeds at every collector in a multi-collector structure is small. In a semiconductor device in which an integrated injection logic cell including a constant current source transistor and a switch transistor is formed on a common semiconductor substrate, a first semiconductor layer (13) doped with a first conductivity type impurity and a second semiconductor layer (19) doped with a second conductivity impurity are electrically isolated from each other on a semiconductor substrate. A plurality of collector electrodes of the switch transistor and a plurality of collector regions (20) based on diffusion of impurity are formed by the second semiconductor layer (19). The first semiconductor layer (13) includes a base electrode deriving portion, and a direct contact portion which directly contacts with the semiconductor substrate between a plurality of collector regions (20). An external base region (17) is formed by diffusion of first conductivity type impurity from the direct contact portion.

6 Claims, 13 Drawing Sheets

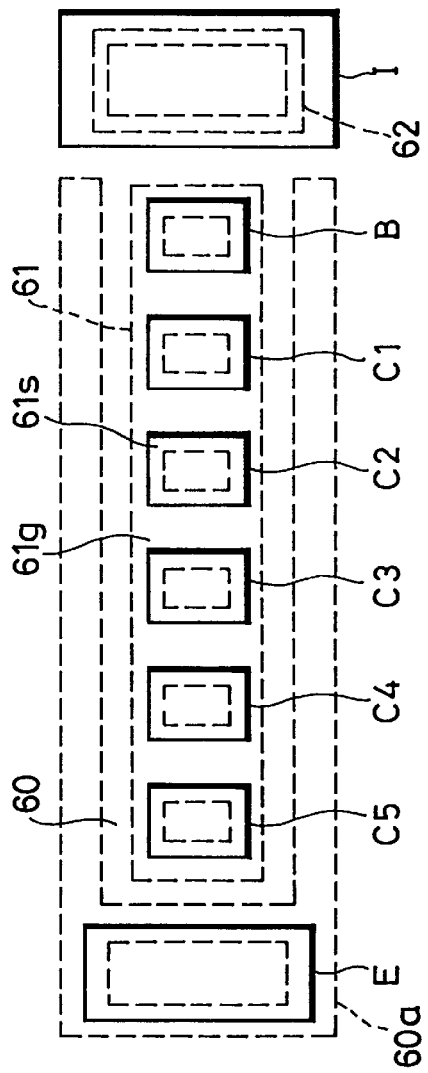
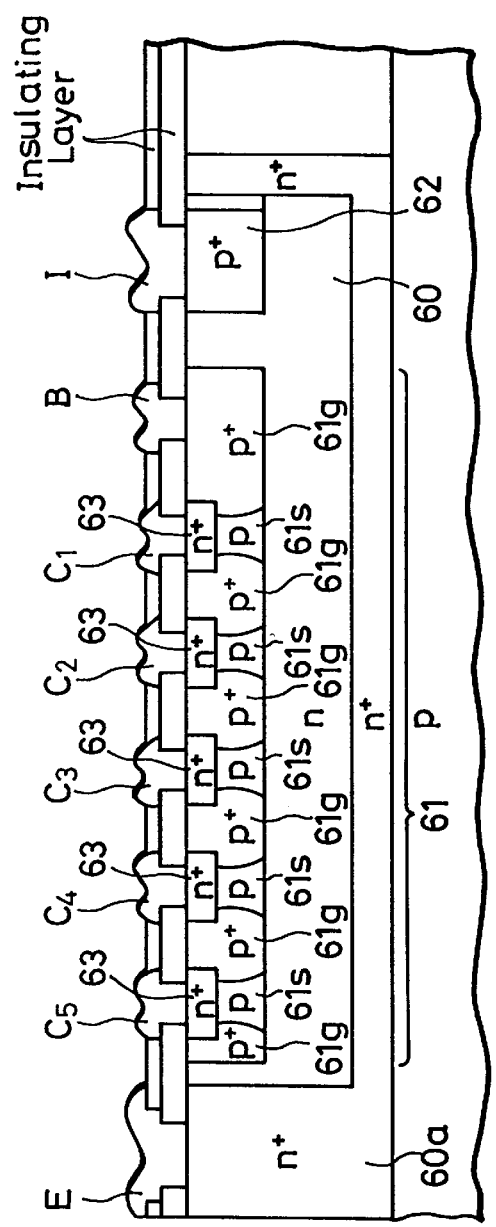
PRIOR ART
FIG. 1A
PRIOR ART
FIG. 1B

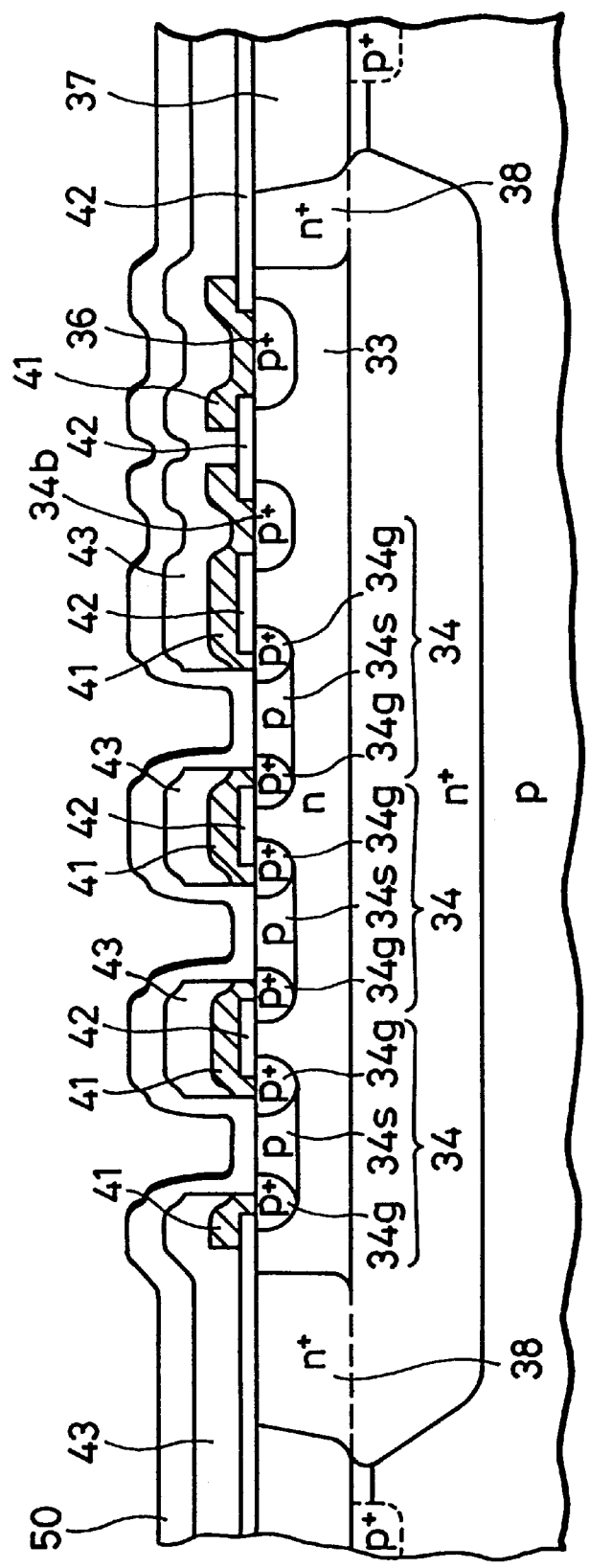

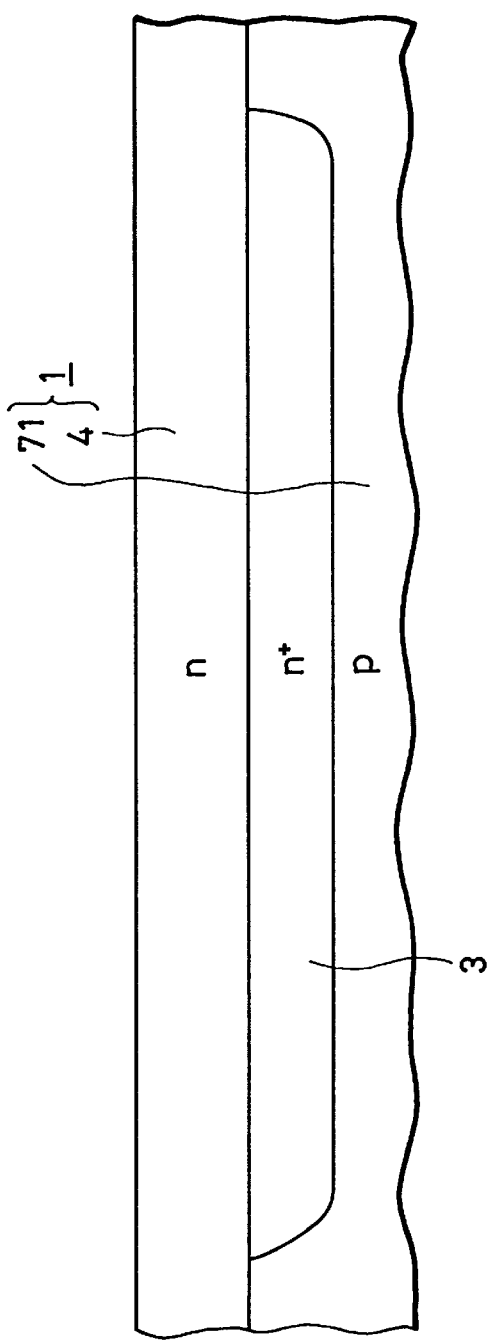
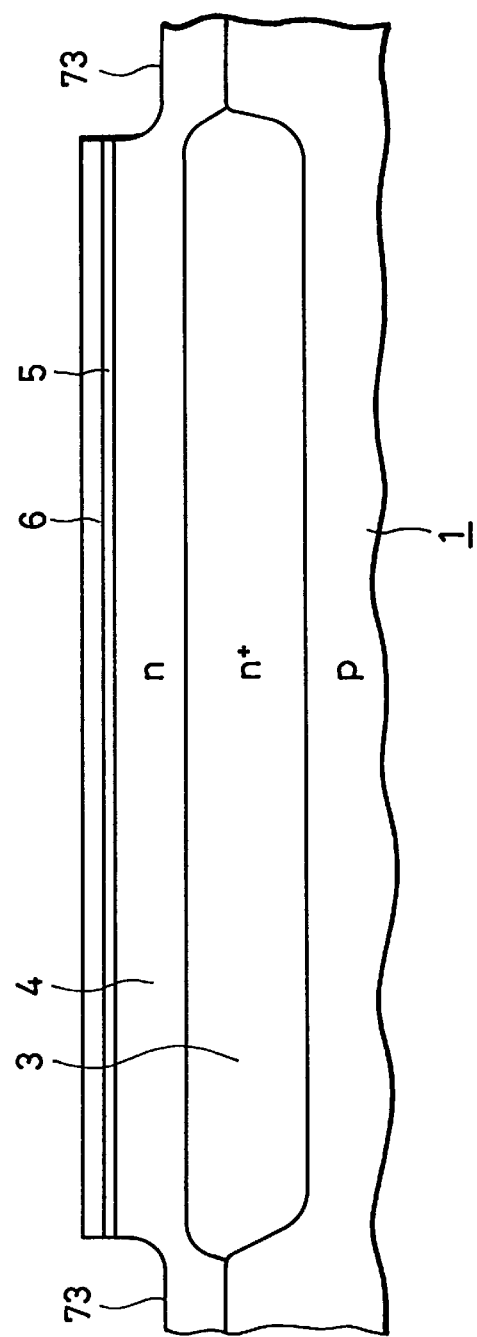
FIG. 5A
FIG. 5B

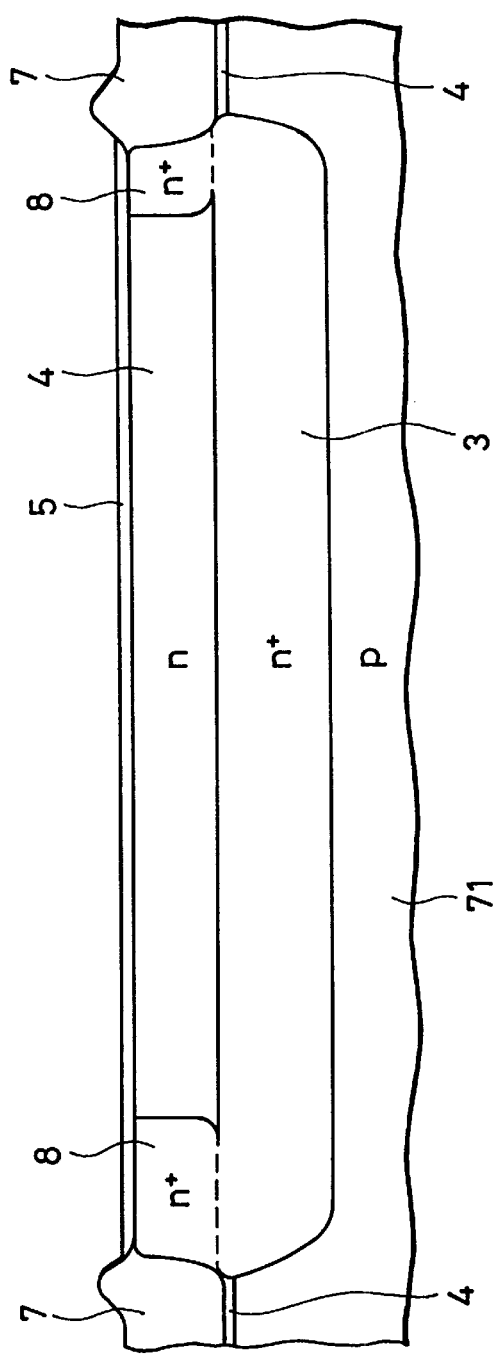
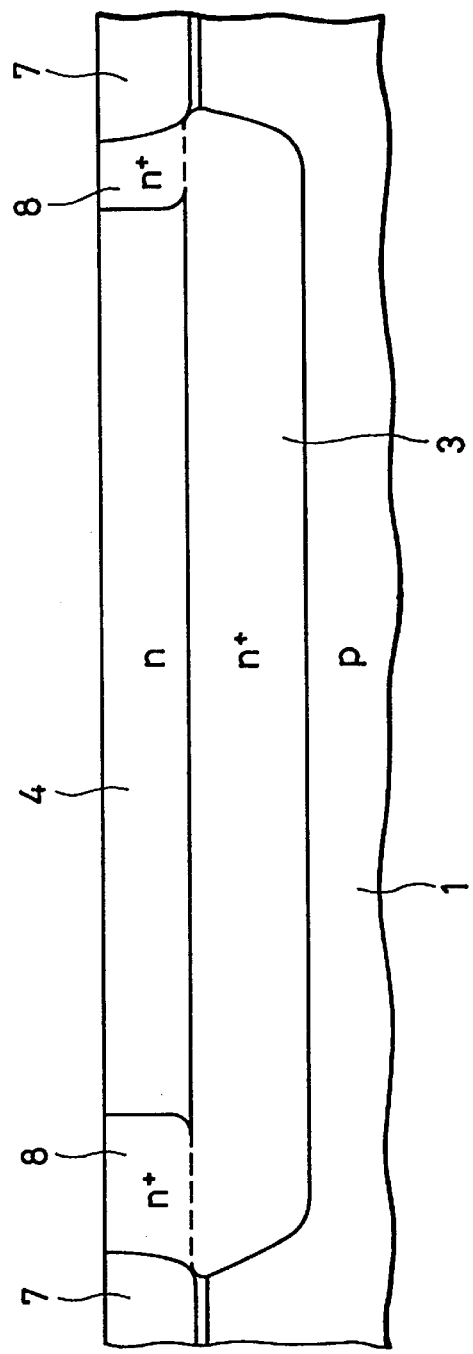
FIG. 6A
FIG. 6B

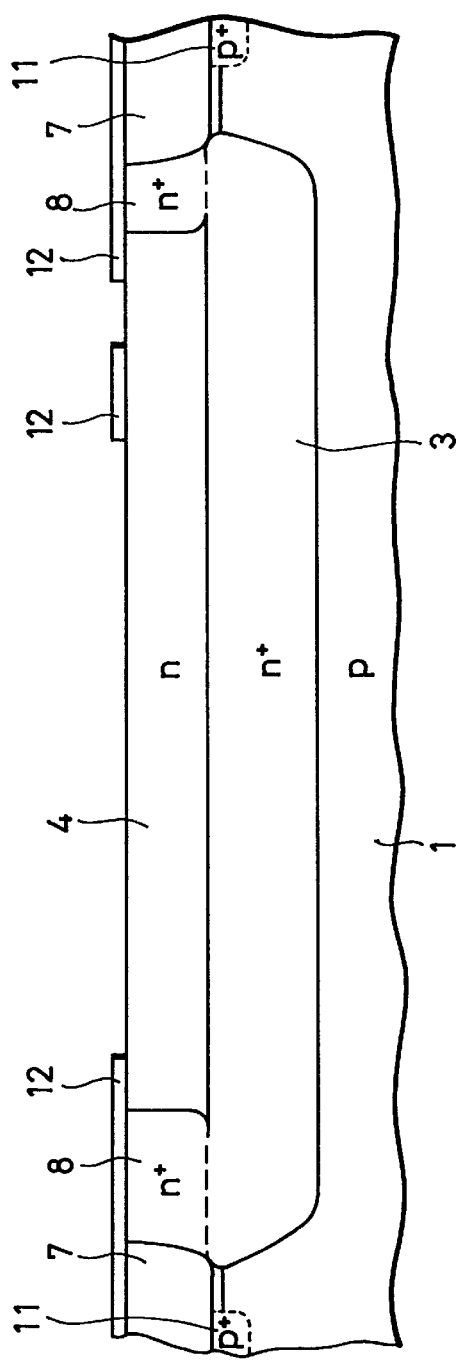
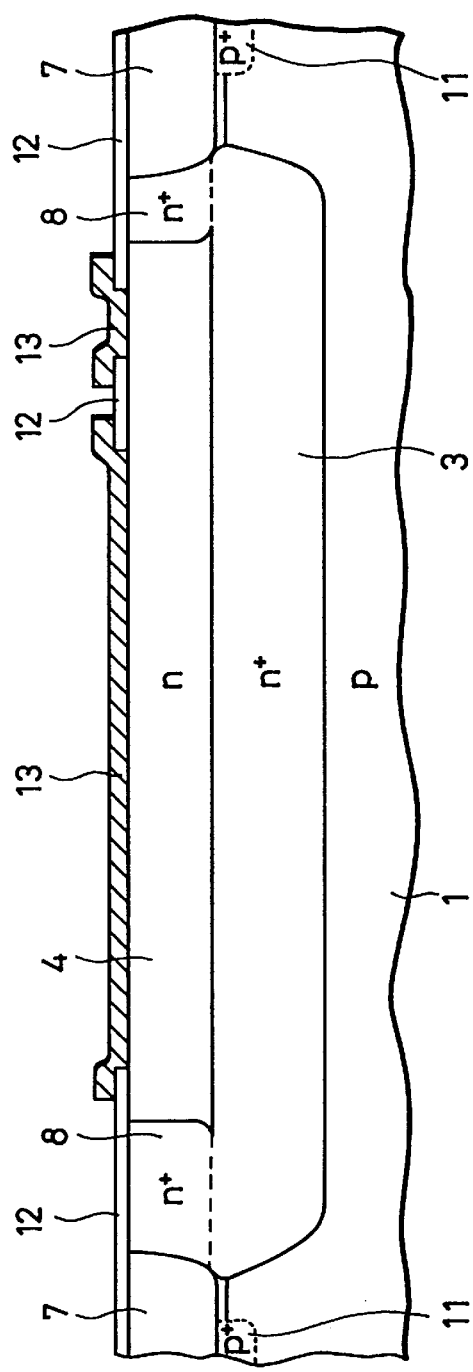
F I G. 7A
F I G. 7B

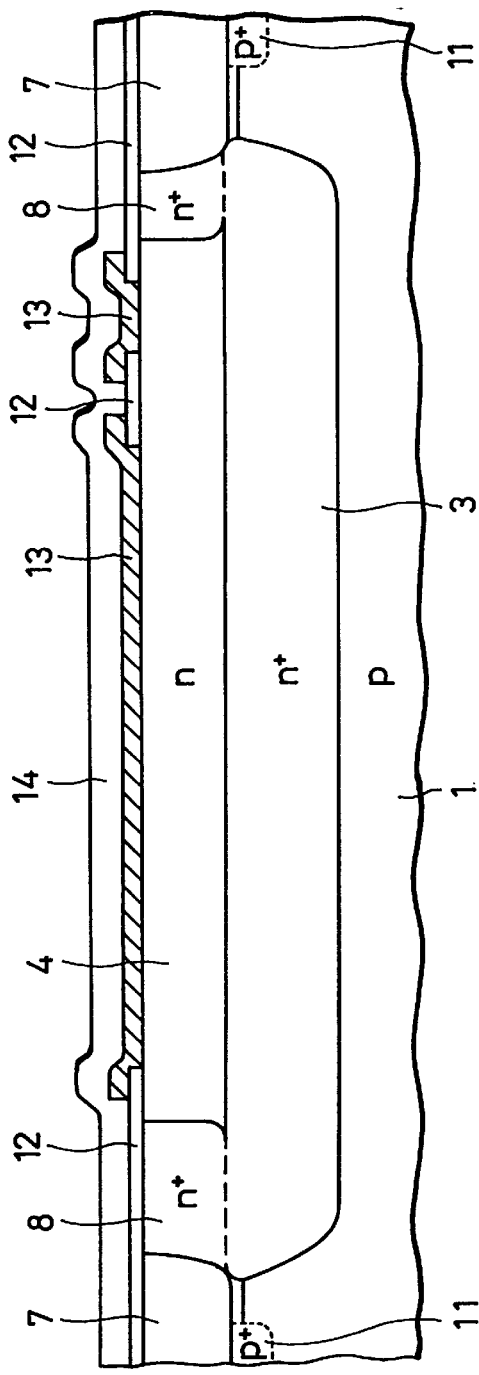
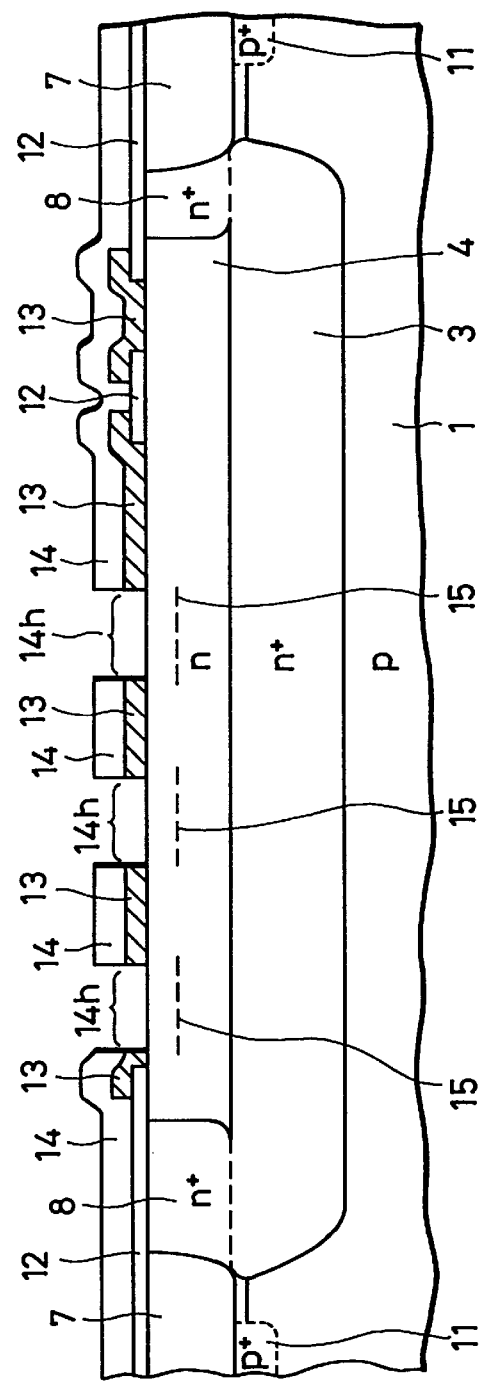
FIG. 8A
FIG. 8B

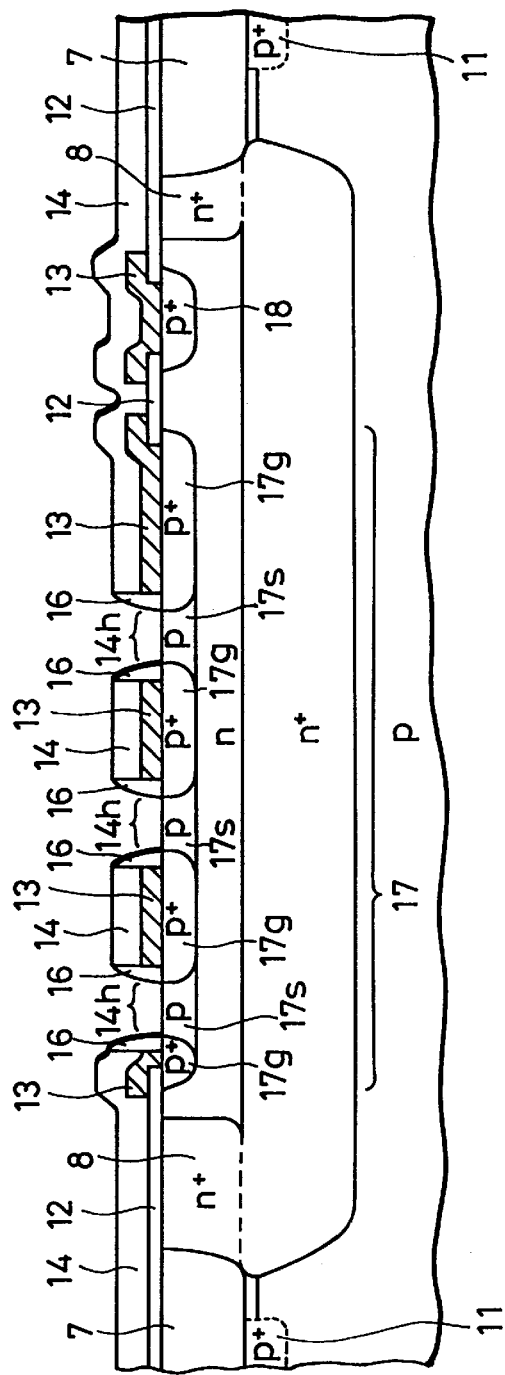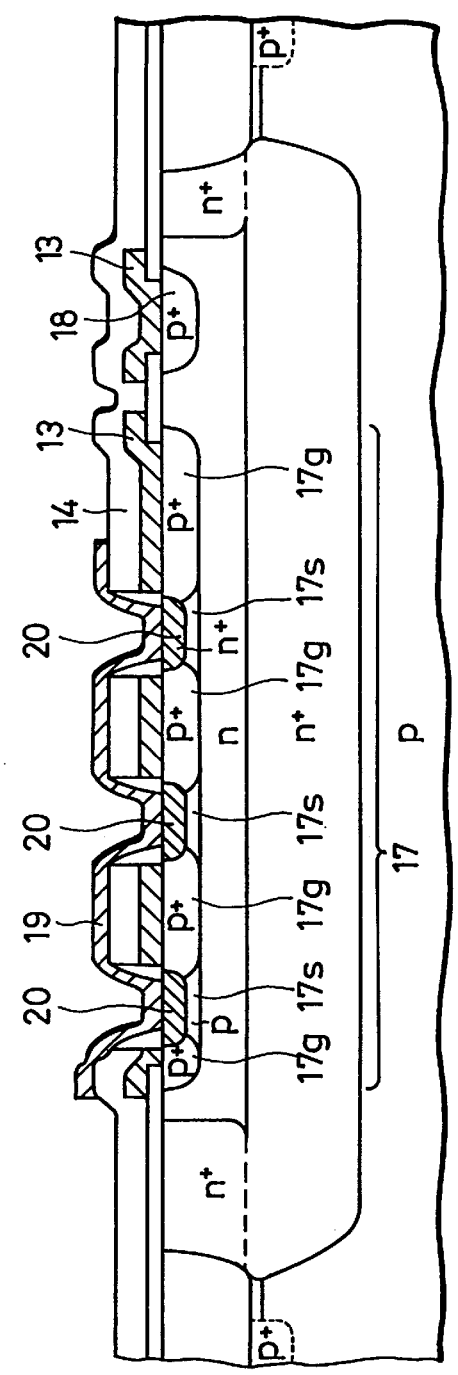
FIG. 9A
FIG. 9B

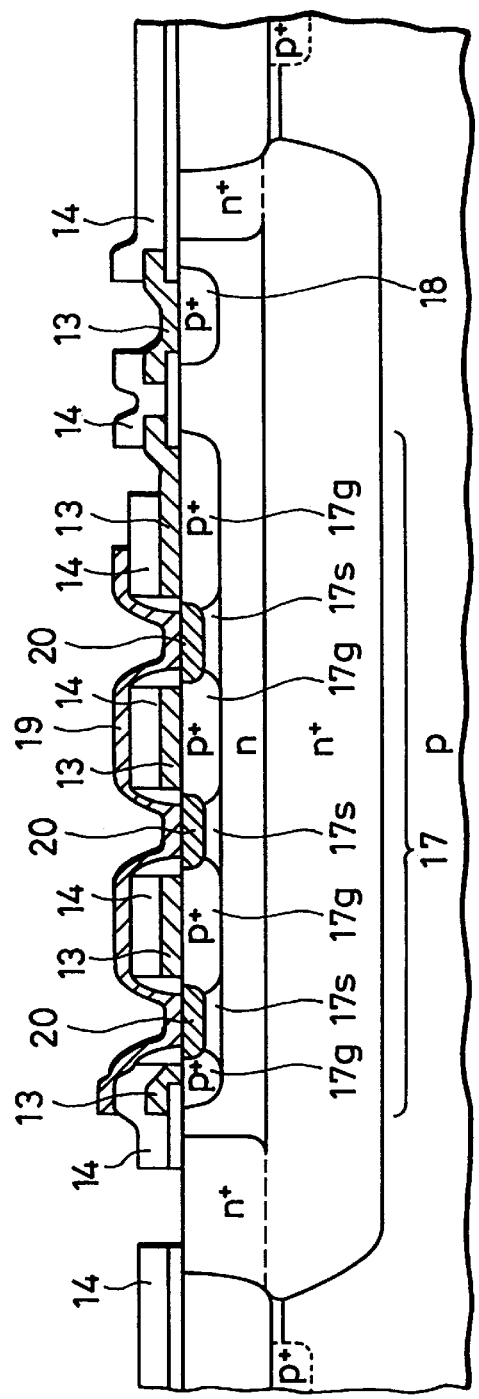
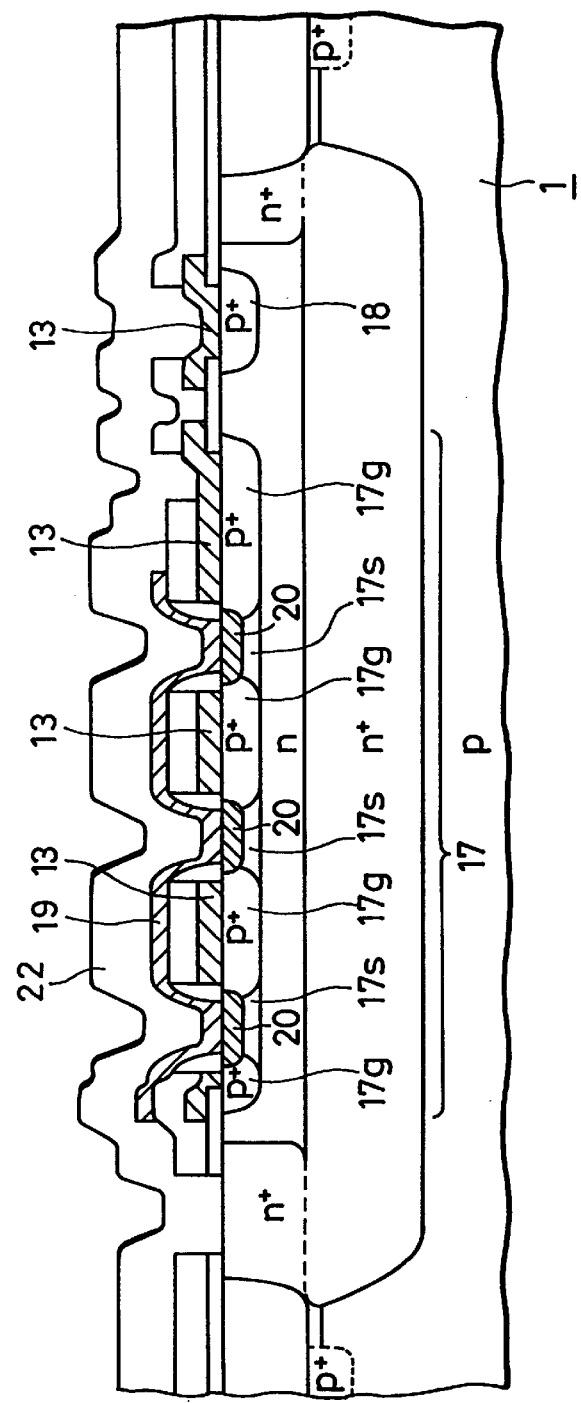
FIG. 10A
FIG. 10B

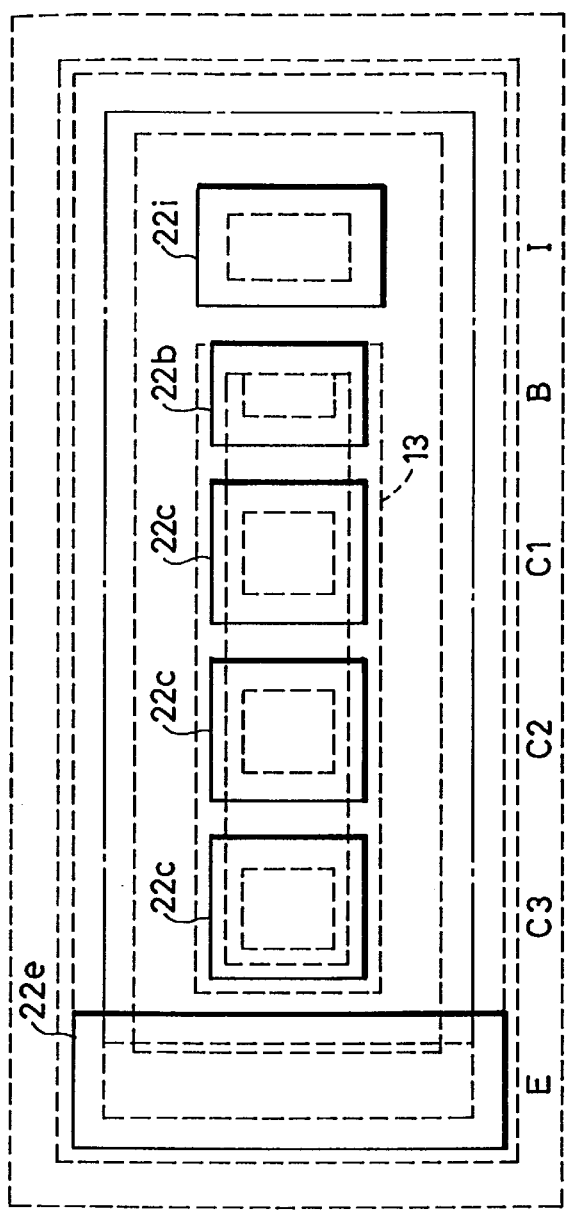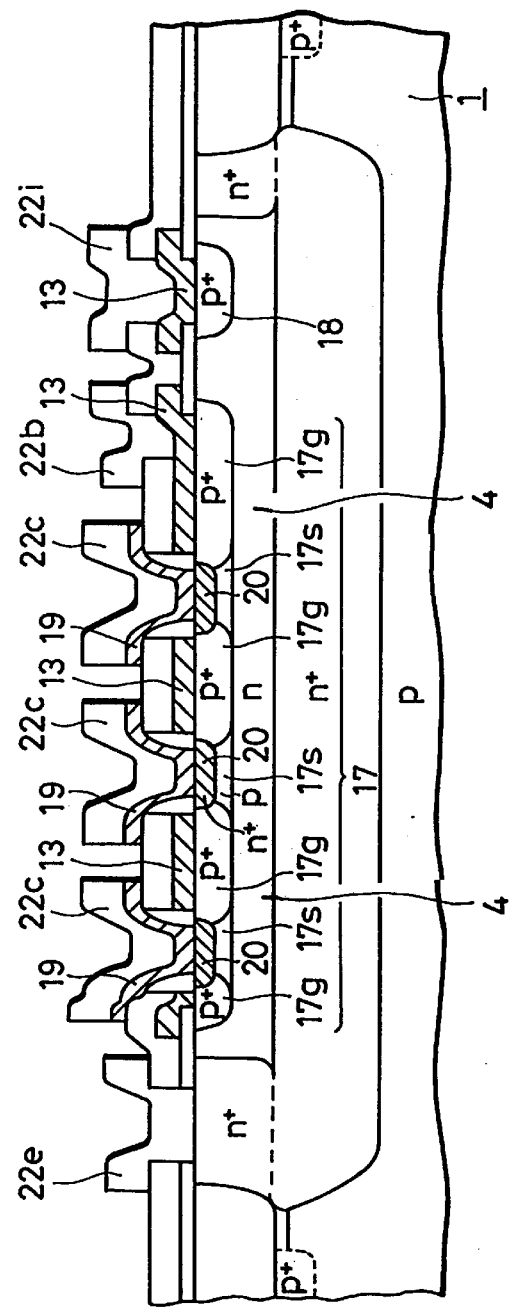
FIG. 11A
FIG. 11B

INTEGRATED INJECTION LOGIC SEMICONDUCTOR DEVICE

BACKGROUND OF THE INVENTION

The present invention relates to a semiconductor device having an integrated injection logic (IIL) cell structure, and a method of fabricating the same.

The integrated injection logic, which is often referred to as "I²L", cell comprises a common semiconductor substrate, a constant current source transistor, and a switch transistor, both of the constant current source transistor and the switch transistor being formed on the above common semiconductor substrate. The most specific feature of the I²L cell lies in that a logic circuit can be easily incorporated therein with high density by the same processing as that of bipolar transistors. The I²L cells have been widely used before CMOS (complementary MOS insulating gate field-effect transistor integrated circuit) became widespread.

At present, as the circuit element is made large-scale, high-speed, low in power consumption, and inexpensive much more by microminiaturization based on CMOS, it is frequently observed that CMOS plays a leading part in forming logic circuits.

On the other hand, the I²L cell structure makes it possible to make a linear circuit in the form of semiconductor chip. In a small or middle scale manufacturing process, the I²L cell structure is inexpensive, and hence used in commercial sector.

Logic circuits based on the I²L cell structure also can be made large-scale, high-speed, low in power consumption, and inexpensive by microminiaturization of circuit element similarly to the CMOS.

In the I²L cell structure, as a means for realizing the microminiaturization of circuit element, it is considered that structure and manufacturing method of emitter/base self-align structure bipolar transistor based on upper and lower two layers of polycrystalline silicon are applied to the I²L cell structure (see T.H. Ning, Symp. of VLSITECH, Invited Paper, Page 34 (1981)).

The logic circuit based on the I²L cell structure includes a multi-collector structure composed of a plurality of collector regions and collector electrodes formed within the unit cell. However, in this I²L cell, switching speeds are different at every collectors composing the multi-collector structure. As a consequence, a designing of circuit becomes difficult, and such logic circuit has not yet been made large-scale.

As a cause that the switching speeds become different at every collectors in the above multi-collector structure, there is enumerated the following one. That is, a base series resistance $R_B$ is increased as the position of the collector becomes distant from the base, and a current amplification factor and a cutoff frequency at a switching transistor (bipolar transistor in the reverse direction) provided within the I²L cell structure are lowered when a potential drop occurs at that portion, resulting in the switching speed being lowered.

FIG. 1A is a plan view of a unit cell of conventional I²L cell structure, and FIG. 1B is a cross-sectional view thereof.

In this example, as illustrated in FIGS. 1A and 1B, on an n-type emitter region 60 surrounded by an emitter electrode deriving region 60a heavily doped with n-type impurity, there are formed a base region 61 composed of a p-type intrinsic base region 61s and an external base region 61g heavily doped with p-type impurity, and an injector region 62 heavily doped with p-type impurity. A plurality of collector regions 63 heavily doped with n-type impurity are formed on the intrinsic base region 61s.

An emitter electrode E, a base electrode B, an injector electrode I, and collector electrodes C (collector electrodes C1 through C5) are respectively formed on respective regions of the emitter electrode deriving region 60a, the external base region 61g, the injector region 62, and the collector region 63 to make an ohmic contact.

Of the above-mentioned regions, the intrinsic base region 61a, and the external base region 61g are formed by implanting ions of low impurity concentration and high impurity concentration through masks.

FIG. 2 is a graph showing a relationship between an injection current of an I²L ring type oscillator and a delay time in the I²L cell structure shown in FIGS. 1A and 1B while an ion injection dose of the external base region 61g is taken as a parameter. In the I²L ring type oscillator, unit cells of odd number are selected. In each unit cell, a base electrode and a collector electrode are connected in series to a base electrode or a collector electrode of adjacent unit cell, and an output of a final gate (base electrode or collector electrode) is oscillated as an input of the first gate, thereby measuring an oscillation frequency and a switching delay time.

A base electrode of adjacent cell and one collector electrode in a plurality of collector electrodes are sequentially connected by Al wire or the like.

Specifically, assuming that $B_1, B_2, B_3, \ldots B_n$ are base electrodes of $1, 2, 3 \ldots$, nth (n is an odd number) unit cells, and that $C_1, C_2, C_3, \ldots, C_n$ are collector electrodes, then electrodes of the same kinds are connected in such a way as in $B_1-B_2, C_2-C_3, B_3-B_4, \ldots, C_{n-1}-C_n$ or electrodes of different kinds are connected in such a way as in $B_1-C_2, B_2-C_3, B_3-C_4, B_4-C_3, \ldots, B_{n-1}C_n$, and finally the electrodes $B_n-C_1$ are connected in a loop-fashion, thereby forming the ring type oscillator.

In FIG. 2, the vertical axis represents a delay time (ns), and the horizontal axis represents an injection current ($\mu$A), each of which is represented by a logarithmic scale.

In FIG. 2, crosses show measured results obtained when a dose of ions implanted on the external base region 61g is $1 \times 10^{14} \text{cm}^{-2}$ and a layer resistance is 500Ω/□, and open circles show measured results obtained when a dose of ions implanted on the external base region 61g is $2 \times 10^{14} \text{cm}^{-2}$ and the layer resistance is 315Ω/□. Open triangles show measured results obtained when the dose of ions implanted on the external base region 61g is $3 \times 10^{14} \text{cm}^{-2}$, and the layer resistance is 230Ω/□, and open squares show measured results obtained when the dose of ions implanted on the external base region 61g is $5 \times 10^{14} \text{cm}^{-2}$ and the layer resistance is 150Ω/□.

When the ring type oscillator comprises a base and a collector which are disposed most closely to each other, or when a base electrode and a collector electrode disposed adjacent to this base electrode in the unit cell are used in the ring type oscillator and these electrodes are disposed at the end of the opposite side of the injector (curve group A in FIG. 2), study of FIG. 2 reveals that a delay time has no dose dependence.

On the other hand, when the ring type oscillator comprises a base electrode and a collector electrode which are disposed most distant from each other, or when the base electrode adjoins the injector and the collector disposed at the end of opposite side of the injector and the base electrode in the unit cell is used in the ring type oscillator (curve group B in FIG.

2), study of FIG. 2 reveals that a delay time is reduced as the dose is increased, i.e., operation speed is increased in the large current side where the injector current is 10 $\mu$A or higher.

In general, the I$^2$L cell is formed at the same time the bipolar transistor is formed on the same semiconductor substrate as other device.

Specifically, I$^2$L cells based on an emitter/base self-align bipolar transistor and a collector/base self-align switch transistor are simultaneously formed by first and second semiconductor layers of polycrystalline silicon. FIG. 3A is a plan view of such I$^2$L cell structure, and FIG. 3B is a cross-sectional view thereof.

In the unit cell of the I$^2$L cell structure shown in the plan view of FIG. 3A, an injector I, a base B, collectors C collectors $C_1$ to $C_3$) and an emitter E are formed from right in FIG. 3A, in that order.

In the cross-sectional view of FIG. 3B, an emitter buried region 32 heavily doped with impurity and an emitter buried region 33 lightly doped with impurity are formed on a p-type semiconductor substrate 31. An injector region 36, a base electrode deriving region 34 and a plurality of base regions 34g each of which is heavily doped with p-type impurity are formed on the emitter region 33, and a plurality of collector regions 35 heavily doped with n-type impurity are formed on the intrinsic base regions 34s, 34s lightly doped with p-type impurity between the respective external base regions 34g. These regions constitute the I$^2$L cell.

Emitter electrode deriving regions 38 are formed around the cell, and isolation insulating layers 37 are formed outside the emitter electrode deriving regions 38.

In actual practice, a plurality of I$^2$L cell are formed on the common semiconductor substrate 31 at the same time, and adjacent cells are overlapped at the positions shown by broken lines in FIG. 3A.

In the above I$^2$L cell, the base region 34 composed of the external base regions 34g and the intrinsic base regions 34s surrounded by the external base regions 34g are formed by the process below as shown in a cross-sectional view of FIG. 4.

Initially, an oxide insulating film 42 is formed on the surface of a semiconductor substrate, and openings are respectively formed through the insulating film 42 at its portions where a base region 34, a base electrode deriving region 34b, and an injector region 36 are formed. First semiconductor layers 41 made of polycrystalline silicon doped with p-type impurity are formed on the emitter region 33 through these openings.

Further, interlayer insulators 43 are formed over the whole surface of the first semiconductor layer 41, and openings are formed through the interlayer insulators 43 and the first semiconductor layers 41 formed under the interlayer insulators 43 at their portion where collector regions are formed. Through these openings, ions of p-type impurity are implanted on the intrinsic base region.

An insulating film 50 is formed over the whole surface by CVD (chemical vapor deposition).

Then, p-type impurities of high concentration are diffused from the first semiconductor layer 41 into the emitter region 33 by annealing, thereby forming the external base regions 34g, the base electrode deriving region 34b, and the injector region 36. Intrinsic base regions 34s are composed of the portions which are formed by implanting p type ions.

In this manner, as shown in the cross-sectional view of FIG. 4, there is formed the base region 34 composed of the intrinsic base region 34s and the external base region 34g.

Thereafter, side walls are formed in the openings of the above collector region forming portions by etching the insulating film 50 by RIE (reactive ion etching) as shown in FIG. 3B. Then, as shown in FIG. 3B, second semiconductor layers 44 of polycrystalline silicon doped with n-type impurity are formed on the intrinsic base regions 34s over the whole collector region forming region through these openings. Subsequently, collector regions 35 are formed by diffusing n-type impurities from the second semiconductor layers 44 by annealing.

Electrode contact openings are formed on the insulating films 42 and the interlayer insulators 43 on the emitter electrode deriving region 38, and electrode contact openings for exposing the first semiconductor layers 41 are formed on the interlayer insulators 43 on the base electrode deriving regions 34b and the injector regions 36. A metal layer such as an Al layer is deposited on the whole surface, and an emitter electrode 45e, a base electrode 45b, an injector electrode 45i, and a collector electrode 45c are respectively formed on the first semiconductor layer 41 on the base electrode deriving region 34b, the first semiconductor layer 41 on the injector region 36, and the second semiconductor layer 44 on each collector region 35 by patterning based on photolithography. The second semiconductor layer 44 is etched away except the collector electrode forming portion after the collector electrode 45c has been treated by patterning.

The base region 34 and the base electrode deriving region 34b are formed by the first semiconductor layer 41, and the positions of the base region 34 and the base electrode deriving region 34b are aligned by the first semiconductor layer 41. Further, the base electrode 45b formed on the base electrode deriving region 34b in ohmic contact is electrically connected to the base regions 34. The collector regions 35 and the base regions 34 are aligned by the second semiconductor layers 44, and the collector electrode deriving regions 34b are aligned with the collector regions 35 by the second semiconductor layers 44.

In the above arrangement, the base electrode 45b and the base regions 34 are electrically coupled by the first semiconductor layers 41 formed on the insulating layer 42, and hence a resistivity of the polycrystalline silicon layer doped with impurity is relatively large. As a consequence, a resistance of bases connected in series concerning the base region distant from the base electrode 45b, in particular, is increased.

SUMMARY OF THE INVENTION

In view of the aforesaid aspect, it is an object of the present invention to provide a logic circuit with I$^2$L cell structure in which a difference of switching speeds at every collectors in a multi-collector structure is small.

According to an aspect of the present invention, there is provided a semiconductor device having an integrated injection logic cell composed of a constant current source transistor and a switch transistor formed on a common semiconductor substrate. This semiconductor device is comprised of a first semiconductor layer doped with a first conductivity type impurity, a second semiconductor layer doped with a second conductivity type impurity, the first and second semiconductor layers being formed on the semiconductor substrate such that they are electrically isolated from each other, a plurality of collector electrodes of the switch transistor being formed by the second semiconductor layer, a plurality of collector regions being formed by diffusion of impurity from the second semiconductor layer, a base electrode deriving portion formed on the first semiconductor layer, a direct contact portion being formed on the first semiconductor layer and which directly contacts with the semiconductor substrate among the collector regions, and an external base region being formed from the direct contact portion by diffusion of the first conductivity type impurity.

According to another aspect of the present invention, there is provided a method of fabricating a semiconductor device having an integrated injection logic cell composed of a constant current source transistor and a switch transistor formed on a common semiconductor substrate. This method is comprised of the steps of forming an element separating and isolating layer on the semiconductor substrate, forming an emitter buried region of the switch transistor, forming openings on the insulating layer at its region covering a portion in which a plurality of collector regions of the switch transistors are formed and at its injection electrode deriving portion, forming a first semiconductor layer of a first conductivity type through the openings of the insulating layer so as to communicate with the semiconductor substrate, patterning the first semiconductor layer, forming a layer insulating layer over the first semiconductor layer, forming openings on the layer insulating layer at its collector region forming portions, an injection electrode deriving portion and the switch transistor emitter electrode deriving portion, forming a second semiconductor layer of a second conductivity type so as to cover the openings of said collector region forming portions of the layer insulating layer, and leaving the collector region and the collector electrode forming portion on the second semiconductor layer by patterning, wherein when the first semiconductor layer is patterned, the injection electrode, the base electrode, and a portion located between the base region forming portion and a plurality of collector regions are left.

According to the present invention, in the integrated injection logic ($I^2L$) cell structure including the constant current source transistor and the switch transistor, with respect to the first semiconductor layer doped with the first conductivity type impurity formed on the semiconductor substrate, there are formed the base electrode deriving portion, and the direct contact portion which directly contacts with the semiconductor substrate between a plurality of collector regions. The external base region is formed by diffusion of the first conductivity type impurity from the direct contact portion, whereby external base regions with low resistance formed by the diffusion of the first conductivity type impurity are continuously formed so as to cover the base electrode deriving portion and a plurality of collector regions.

As described above, since the external base regions with low resistance are continuously formed under the base electrode deriving portion and a plurality of collector regions, a resistance between the base and the collector can be reduced.

When the first semiconductor layer is formed, the first semiconductor layer is patterned so as to leave the injection electrode, the base electrode, the base region forming portion, and a portion located between a plurality of collector regions, whereby the aforementioned direct contact portion is formed on the portion located between the base region forming portion and a plurality of collector regions. Therefore, the external base region with low resistance can be continuously formed between a plurality of collector regions by diffusing impurity from the direct contact portion.

BRIEF DESCRIPTION OF THE DRAWINGS

FIGS. 1A and 1B are a plan view and a cross-sectional view of a conventional $I^2L$ cell structure;

FIG. 4 is a cross-sectional view used to explain a process executed when the $I^2L$ cell structure shown in FIGS. 3A and 3B is manufactured;

FIGS. 5A and 5B are cross-sectional views showing an $I^2L$ cell structure according to the present invention, and processes of a method of manufacturing such $I^2L$ cell structure according to the present invention;

FIGS. 6A and 6B are cross-sectional views showing an $I^2L$ cell structure according to the present invention, and processes of a method of manufacturing such $I^2L$ cell structure according to the present invention;

FIGS. 7A and 7B are cross-sectional views showing an $I^2L$ cell structure according to the present invention, and processes of a method of manufacturing such $I^2L$ cell structure according to the present invention;

FIGS. 8A and 8B are cross-sectional views showing an $I^2L$ cell structure according to the present invention, and processes of a method of manufacturing such $I^2L$ cell structure according to the present invention;

FIGS. 9A and 9B are cross-sectional views showing an $I^2L$ cell structure according to the present invention, and processes of a method of manufacturing such $I^2L$ cell structure according to the present invention;

FIGS. 10A and 10B are cross-sectional views showing an $I^2L$ cell structure according to the present invention, and processes of a method of manufacturing such $I^2L$ cell structure according to the present invention;

FIGS. 11A and 11B are a plan view and a cross-sectional view showing an $I^2L$ cell structure according to the present invention;

DETAILED DESCRIPTION OF THE PREFERRED EMBODIMENTS

Figure 2:
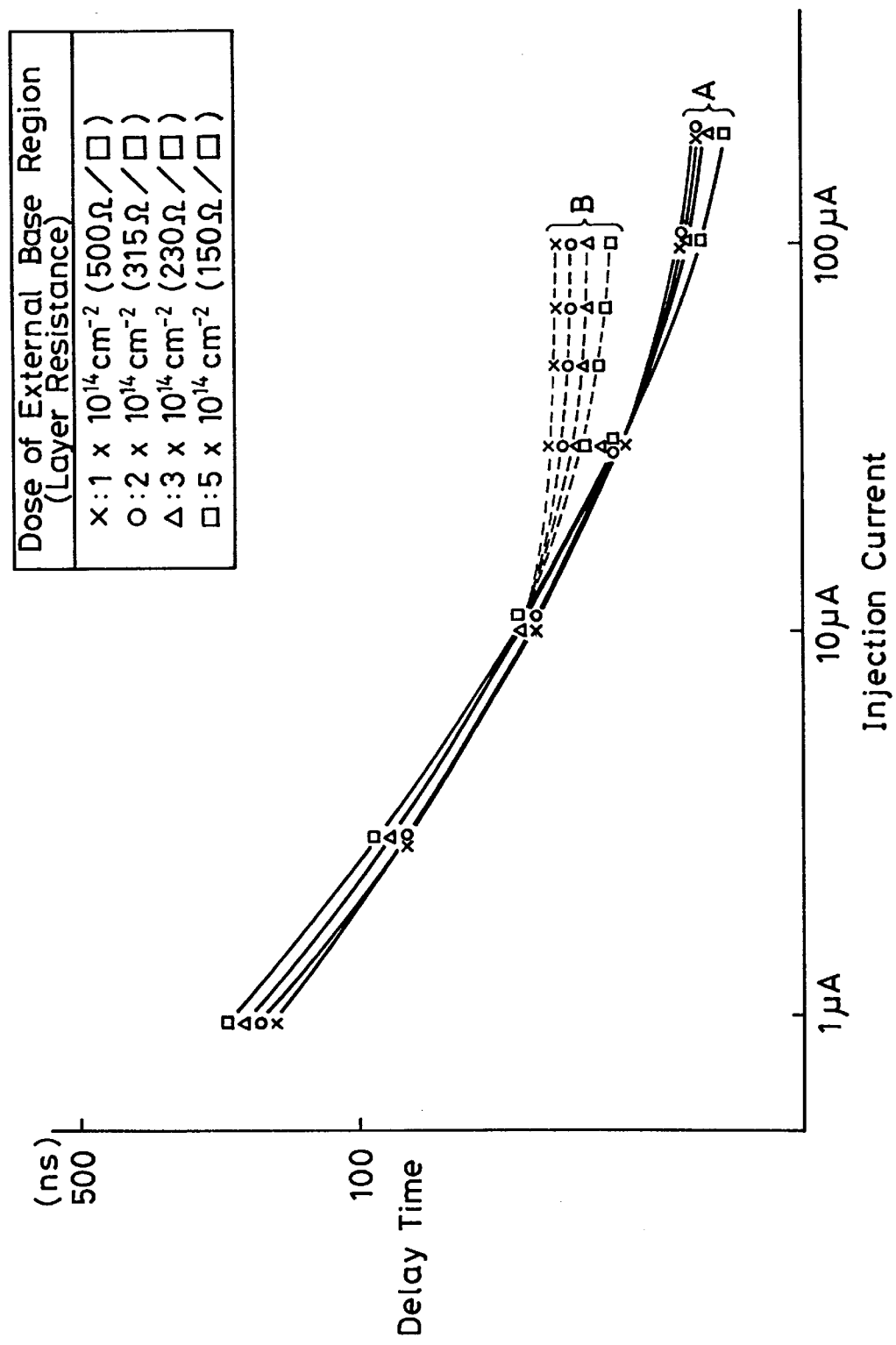
FIG. 2 is a graph showing a relationship between impurity concentration of gate region, and a delay time of a ring type oscillator formed of an $I^2L$ circuit.

A semiconductor device according to the present invention and a method of fabricating such semiconductor device will be described with reference to the drawings.

As shown in FIG. 5A, there is prepared a semiconductor substrate 71 formed of a first conductivity type, e.g., p-type amorphous monocrystalline silicon wafer whose major surface is (111) crystal plane. An impurity diffusion mask layer (not shown) formed of an oxide film with a thickness of 300 nm is formed on the surface of the semiconductor substrate 71 by thermally oxidizing the semiconductor substrate 71, and a diffusion window is formed through the portion in which the $I^2L$ cell is formed. A buried region 3 heavily doped with an impurity is formed on one major surface of the substrate 71 by diffusing impurity of different conductivity, i.e., n type impurity. The diffusion of impurity forming this buried region 3 is carried out by gas phase diffusion of Sb using $Sb_2O_3$ at a substrate temperature of about 1200° C. Then, there is formed the buried region 3 in which a surface resistance $\rho_s$ is 20 to 50 Ω/□ and a depth $X_j$ is about 1 to 2 μm. Thereafter, the oxide film of the above diffusion mask is removed by etching, and a silicon semiconductor layer of the same conductivity type as that of the buried layer 3, i.e., n type is epitaxially deposited on the semiconductor substrate 71, where by an epitaxial layer 4 with a thickness of about 0.7 to 2 μm and whose resistivity is 1 to 5 Ωcm is formed, resulting in the semiconductor substrate 1 being formed.

As shown in FIG. 6A, on the epitaxial layer 4 at its outer peripheral portion of the portion in which the I²L cell is finally formed, there is formed an isolation insulating layer 7 by a local thermal oxidation, i.e., LOCOS (local oxidation of silicon). To this end, as shown in FIG. 6B, there is formed an oxide film 5 which serves as a buffer layer with a thickness of 20 to 50 nm by thermally oxidizing the surface of the epitaxial layer 4. An oxide-proof film 6 is formed on the whole surface of the oxide film 5 by epitaxially depositing $Si_3N_4$, for example, with a thickness of about 50 to 100 nm by low pressure CVD. Then, openings are formed on the portion in which the isolation insulating layer 7 is formed by pattern-etching the oxide-proof film 6 and the buffer layer according to photolithography. Grooves 73 are formed by etching the epitaxial layer 4 to a predetermined depth through the openings. The isolation insulating layer 7 with a thickness of about 0.8 to 1.5 μm is formed within the grooves 73 exposed to the outside through similar openings by steam oxidation at a temperature of 1000 to 1050° C. for 2 to 6 hours. In this case, the depth of the groove 73 is selected such that the surface of the isolation insulating layer 7 formed within the groove 73 can form substantially the same plane with the surface of the semiconductor substrate 1, e.g., about ½ of the thickness of the isolation insulating layer 7.

As shown in FIG. 6A, $Si_3N_4$ of the oxide-proof film 6 is etched off by thermal phosphoric acid, and an opening is formed on the I²L cell forming portion at its portion in which an emitter electrode deriving region is formed by photolithography.

Emitter electrode deriving regions 8 are formed on the openings by implanting ions of n-type impurity, e.g., $P^+$(phosphorus) at 40 to 100 keV with a dose of $10^{15}$ to $10^{16}$ cm$^{-2}$ as shown in FIG. 6A.

As shown in FIG. 6B, the surface planarization is carried out. Although not shown, a planarization film of $SiO_2$ film with a thickness of 100 to 600 nm is formed on the whole surface by planarization.

Then, annealing is carried out at a temperature of 900 to 1000° C. for about 30 minutes, and the emitter electrode deriving regions 8 are diffused.

A resist is coated in order to make the upper portion of the isolation insulating layer 7 flat by LOCOS, and the whole surface of the semiconductor substrate 1 including the isolation insulating layer 7 is made flat by etch back as shown in FIG. 6B.

An oxide film (not shown) with a thickness of about 10 to 30 nm is formed on the whole surface of the epitaxial layer 4 by thermal oxidation at 900° C.

A p-type isolation insulating region 11 heavily doped with an impurity is formed by implanting a first conductivity type, i.e., p-type impurity ions, e.g., B (boron) at 200 to 500 keV with a dose of $10^{13}$ to $10^{14}$ cm$^{-2}$ by using the resist as an ion implantation mask.

Then, as shown in FIG. 7A, an oxide insulating layer 12 of $SiO_2$ with a thickness of 50 to 200 nm is formed on the whole surface so as to cover the surface. Subsequently, openings are formed on the epitaxial layer 4 at its regions including the portions in which the injection electrode deriving portion is formed and a plurality of collector regions are formed by etching the oxide insulating layer 12 by RIE using $O_2$/$CHF_3$ gas.

As the first semiconductor layer 13, a polycrystalline silicon layer heavily doped with a second conductivity impurity, e.g., B (boron) is formed on the whole surface including the above openings so as to have a thickness of 100 to 300 nm. Further, as shown in FIG. 7B, the first semiconductor layer 13 is patterned by etching by RIE using $C_2Cl_3F_3$/$SF_6$ gas or the like so as to leave the injection electrode, the base electrode forming portion, the base region forming portion and the portion located between the collector regions.

Subsequently, an interlayer insulator 14 made of $SiO_2$ oxide layer, for example, with a thickness of 300 to 500 nm is formed on the whole surface by CVD as shown in FIG. 8A.

As shown in FIG. 8B, openings 14h of collector forming regions are formed by etching the interlayer insulator 14 and the first semiconductor layer 13 formed beneath the interlayer insulator 14 by RIE using $O_2$/$CHF_3$ gas and $C_2Cl_3$/$SF_6$ gas.

An oxide film (not shown) with a thickness of 5 to 30 nm is formed on the surface of the semiconductor substrate 1 by thermal oxidation, and ion implantation regions 15 of base region are formed by implanting ions of a first conductivity type, i e. p-type impurity $B^+$ (boron) from the collector forming region openings 14 at 20 to 100 keV with a dose of $10^{13}$ to $10^{14}$ cm$^{-2}$.

If it is intended to improve a high-speed performance much more, then a pedestal region heavily doped with a second conductivity type, i.e., n-type for reducing an emitter resistance is formed by implanting a second conductivity type, e.g., $P^+$ ions at 300 to 500 keV with a dose of about $10^{12}$ cm$^{-2}$, although not shown.

Although not shown, an insulating layer such as $SiO_2$ with a thickness of 300 to 600 nm which forms a side wall is formed on the whole surface by CVD, and annealed at a temperature ranging from 800 to 950° C. for 10 to 60 minutes. In this case, B (boron) with a high concentration is diffused from the openings 14h to the epitaxial layer 4, and an external base region 17g and the injector region 18 of I²L cell structure are formed. An intrinsic base region 17s also is formed from the ion implanted region 15 of the base region. These regions 17g, 17s and 18 also are diffused in the succeeding annealing.

Side wall insulating films 16 are formed by etching the insulating layer such as $SiO_2$ formed on the whole surface by CVD by RIE using $O_2$/$CHF_3$ gas as shown in FIG. 9A.

Then, a polycrystalline silicon layer heavily-doped with a second conductivity type impurity, e.g., As (arsenic) for collector electrode is formed so as to have a thickness of 50 to 200 nm by CVD as a second semiconductor layer 19 including the openings 14h.

Alternatively, after the polycrystalline silicon layer has been formed by CVD, the second semiconductor layer 19 may be formed by implanting ions of $As^+$ at 30 to 100 keV with a dose of $10^{15}$ to $10^{16}$ cm$^{-2}$.

Although not shown, an oxide layer of $SiO_2$ or the like with a thickness of 300 nm for protection upon annealing is formed on the whole surface by CVD.

The above oxide layer is annealed at a temperature higher than 800° C. for about several tens of minutes, and further annealed at a temperature ranging from 900 to 1100° C. for several seconds to several tens of seconds, whereby collector regions 20 are formed at the ion implanted portions through the openings 14h.

After annealing, the above protection oxide film is etched off by wet etching.

Then, as shown in FIG. 9B, the second semiconductor layer 19 is etched by use of $C_2Cl_3F_3/SF_6$ gas or the like so as to leave the second semiconductor layer 19 only on the collector region 20 and the collector electrode forming portion.

As shown in FIG. 10A, openings for deriving a base electrode, an emitter electrode and an injector electrode of $I^2L$ structure are formed by pattern-etching the interlayer insulator 14 and the insulating layer 12 according to RIE or the like.

Then, as shown in FIG. 10B, an Al layer 22 is formed on the whole surface so as to cover the surface through a barrier metal (not shown) formed of a laminated layer of titanium and titanium nitride by sputtering.

Openings are formed on the Al layer 22 by etching the Al layer 22 according to RIE.

Thereafter, an emitter electrode 22e, a base electrode 22b, an injector electrode 22i and collector electrodes 22c made of Al metal layer, for example, are formed through ordinary multilevel interconnection process. An extra second semiconductor layer 19 is etched off at the portion in which the collector electrode 22c is formed.

As described above, the $I^2L$ cell shown in a plan view of FIG. 11A and a cross-sectional view of FIG. 11B can be formed. In this $I^2L$ cell structure, the constant current source transistor and the switching transistor are formed on the common semiconductor substrate. The first semiconductor layer 13 doped with the first conductivity type impurity and the second semiconductor layer 19 doped with the second conductivity type impurity are electrically isolated from each other on the semiconductor substrate 1, and the second semiconductor layer forms a plurality of collector electrodes 22 of the switching transistor, and a plurality of collector regions 20 due to impurity diffusion. Further, in the first semiconductor layer 13, the direct contact portion which directly contacts with the semiconductor substrate 1 is formed between the base electrode deriving portion and a plurality of collector regions 20. The external base region 17g is formed by the first conductivity type impurity diffusion from the direct contact portion.

Figure 3A:
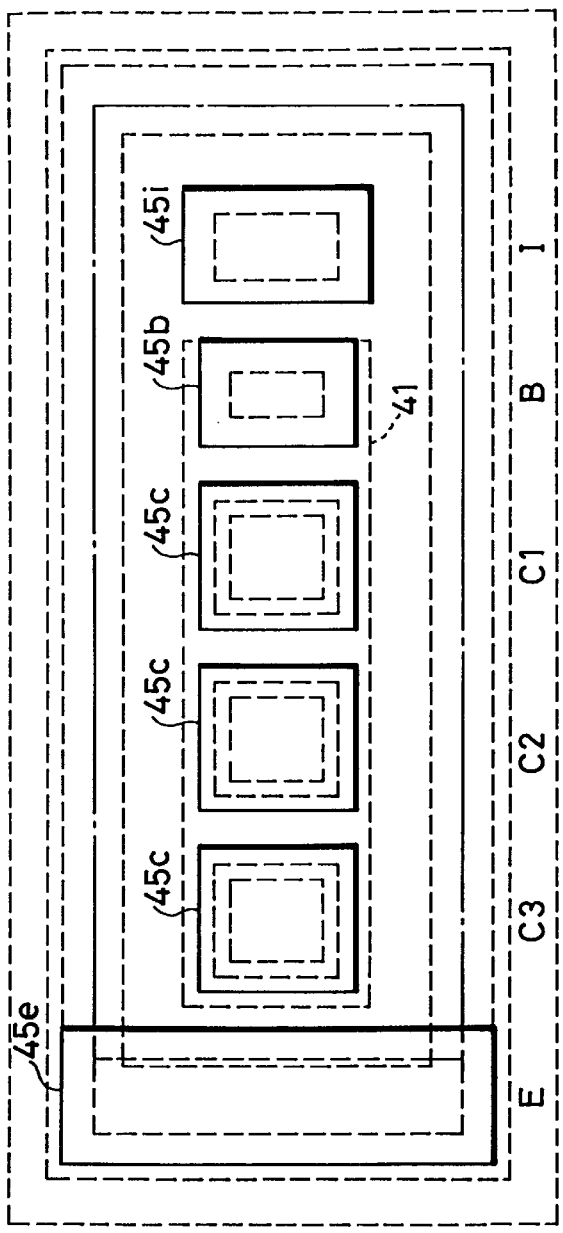
FIG. 3A is a plan view of $I^2L$ cell structure to which there is applied a bipolar transistor with an emitter/base self-align structure composed of two layers of polcrystalline silicon.
Figure 3B:
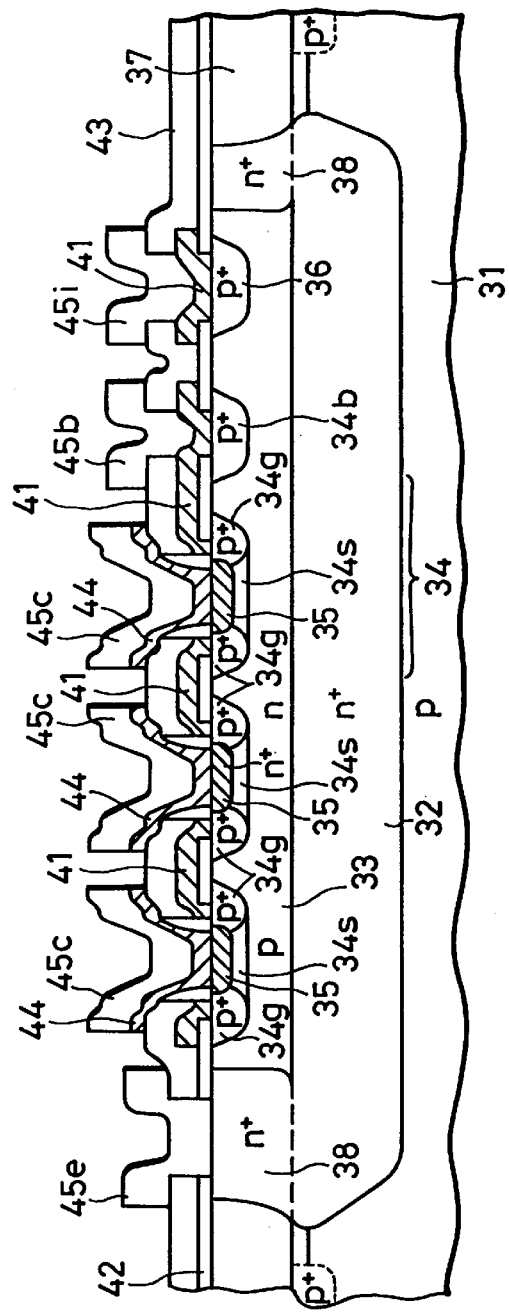
FIG. 3B is a cross-sectional view thereof.

The most specific feature of the $I^2L$ cell thus obtained lies in that the external base region 17g of low resistance is considerably large as compared with the conventional structure shown in FIGS. 3A and 3B.

In actual practice, a plurality of $I^2L$ cell thus formed are formed on the common semiconductor substrate 1 at the same time, and in its layout, adjacent cells are overlapped as shown by broken lines in FIG. 11A.

Since the $I^2L$ cell according to the present invention includes the first semiconductor layer 13 and the diffusion layer formed by introduction of impurity which are formed in parallel between each collector electrode and the base electrode, the base series resistance $R_B$ in the base region 17 is reduced to about ½ to ⅓ as compared with the case where the base series resistance $R_B$ is obtained from the single layer of the first semiconductor layer with the conventional structure shown in FIGS. 3A and 3B.

As compared with the conventional example where the base resistance is not reduced as shown in FIGS. 3A and 3B, the size of the $I^2L$ cell is determined by restrictions imposed on the size of Al pattern used when respective electrodes are formed. Therefore, both of the $I^2L$ cells become the same in size, and the size of the cell structure need not be varied when the present invention is applied.

In the conventional $I^2L$ cell shown in FIGS. 1A and 1B, the intrinsic base region 61s and the external base region 61g are formed by diffusion of implanted ions, and the depth of the whole base region 61 is increased. Further, since ions are implanted by forming windows on the resist, an extra portion for mask alignment is required, and the width is increased. As a result, the width of the base region 61 is increased, and the cell size cannot be reduced. Furthermore, since the respective regions are formed by implanting ions, a resistance of the external base region is increased comparatively.

Since the external base region is formed by diffusion from the first semiconductor layer and the base-collector layer is formed by the self-align technique using the semiconductor layer of two layers according to the manufacturing method of the present invention, the external base region with small thickness and low resistance can be formed. Therefore, the base resistance can be reduced and also the $I^2L$ cell can be microminiaturized.

In the above embodiment, the $I^2L$ cell structure can be surrounded in an annular fashion by the emitter electrode deriving region 8, and an extraneous electrical noise can be cut off, thus making it possible to operate a logic circuit stably. However, the $I^2L$ cell may be surrounded by the isolation insulating layer 7 and the buried layer 3 formed by LOCOS oxidation instead of the annular emitter electrode deriving region 8. An example of such case will be described below.

In this embodiment, in the manufacturing method of the semiconductor device according to the embodiment 1, the emitter electrode deriving region 8 formed by implanting n-type impurity as shown in FIG. 6A is formed on only one side of the unit $I^2L$ cell structure. Further, the isolation insulating layer 7 formed by LOCOS oxidation is overhung on the n-type buried layer 3 in the side in which the emitter electrode deriving region 8 is not formed.

Figure 12:
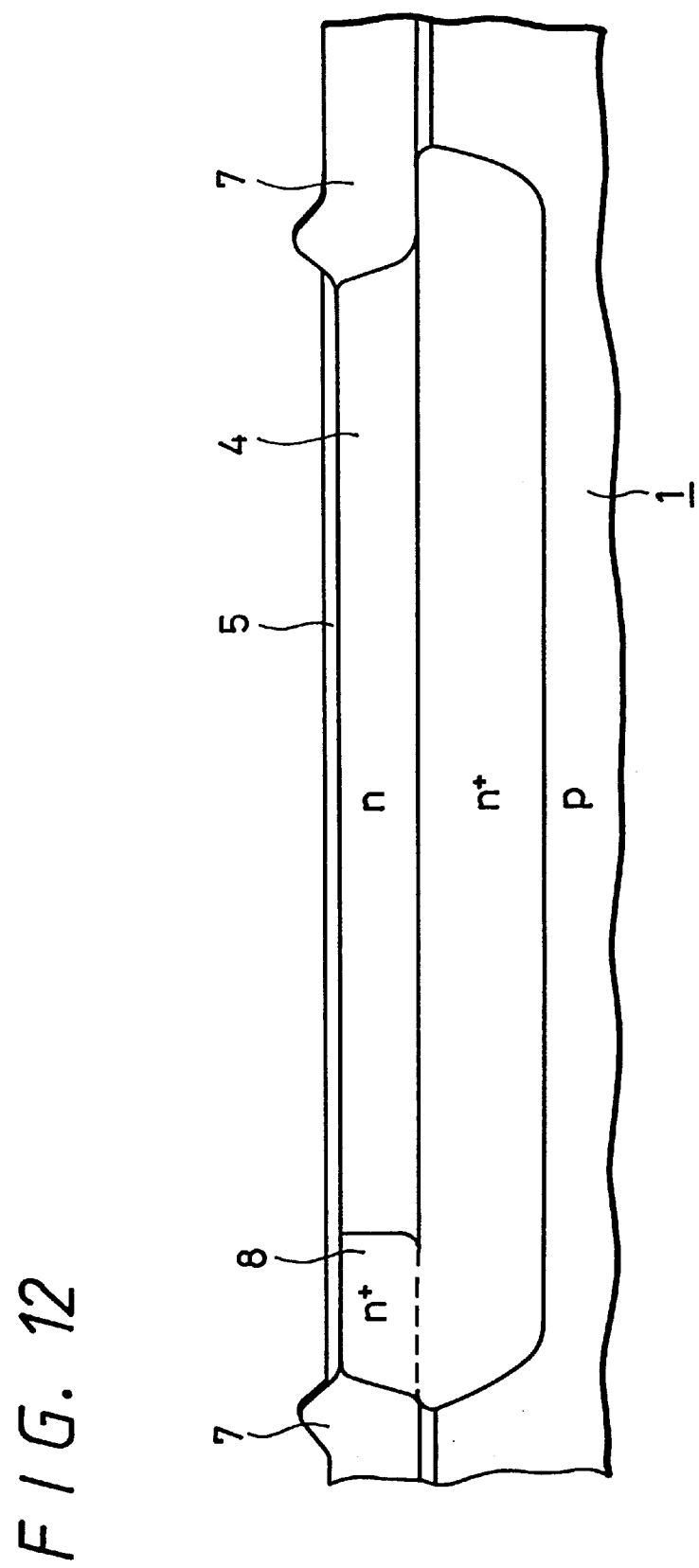
FIG. 12 is a cross-sectional view showing an $I^2L$ cell structure according to the present invention, and a process of a method of manufacturing such $I^2L$ cell structure according to another embodiment of the present invention.

An actual forming method will be described with reference to cross-sectional views which are process diagrams of FIGS. 5A, 5B through FIGS. 11A, 11B and FIG. 12 used in the above embodiment. In FIG. 12, like elements and parts corresponding to those of FIGS. 5A, 5B through FIGS. 11A, 11B are marked with the same references.

In this embodiment, the emitter electrode deriving region 8 shown in FIG. 6A is formed on only one side of the unit cell as shown in the cross-sectional view of FIG. 12, e.g., on the left-hand side of the cross-sectional view of FIG. 12. In the right-hand side where the emitter electrode deriving region 8 is not formed, the isolation insulating layer 7 which is formed in advance by oxidation based on LOCOS technique is formed also on the upper portion of the buried layer 3.

The processes up to the process for forming the emitter electrode deriving region 8 and the process for forming respective electrodes may be similar processes to those of the above embodiment.

Figures 13A, 13B:
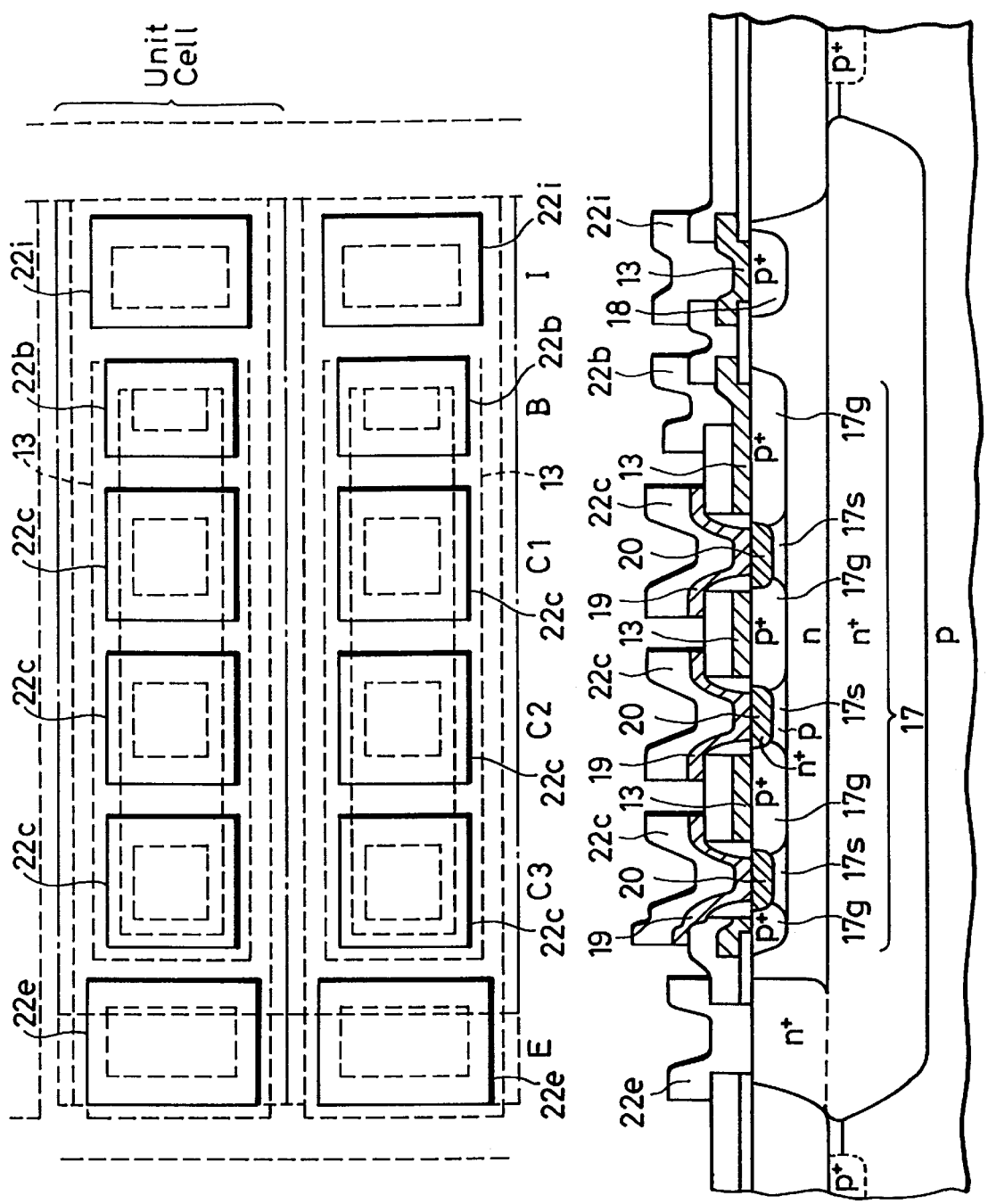
FIGS. 13A and 13B are a plan view and a cross-sectional view showing an $I^2L$ cell structure according to a further embodiment of the present invention.

Then, as shown in a plan view and a cross-sectional view of FIGS. 13A and 13B, in this embodiment, a plurality of unit $I^2L$ cells are arrayed in parallel to each other. In this case, adjacent two cells commonly contain the isolation insulating layer 7, and adjoin each other through the isolation insulating layer 7. Specifically, broken lines in FIG. 13A become borders of unit cells.

Having compared FIG. 13A with FIG. 11A, it is to be understood that the width and length of the unit I²L cell are reduced.

Accordingly, if the outside of the cell structure is surrounded by the isolation insulating layer 7 instead of the emitter electrode deriving region 8, then the distance between the adjacent cell structures can be made close to the minimum width of the isolation insulating layer 7. Thus, it becomes possible to microminiaturize the cell structure much more.

While the first conductivity type is p type and the second conductivity type is n type as described above, the present invention is not limited thereto, and it is possible to form an I²L cell structure in which the substrate is n-type substrate, the first conductivity type is n type, and the second conductivity type is p type.

While the semiconductor layers forming emitter and base are formed as the polycrystalline silicon layers as described above, and the present invention is not limited thereto. If at least one of such semiconductor layers is made of other material, e.g., laminated layer of polycrystalline silicon layer and a high fusing point metal layer such as silicide ($WSi_x$, etc.), it is possible to form the inventive I²L cell similarly.

As described above, according to the present invention, the switching speed of collector can be increased.

According to the present invention, in the I²L cell, if the insulating film formed beneath the collector electrode is omitted, and the size of the base region with low resistance is increased, the microminiaturization of I²L cell structure and the reduction of base resistance can both be realized.

Since the cell structure is microminiaturized, the designing of the semiconductor device using the I²L cell structure can be increased in freedom, and hence the semiconductor device can be miniaturized.

Further, since the base resistance is reduced, a difference of switching speeds in every collectors is reduced, and the switching speed is increased. Therefore, performance of logic circuit based on the I²L cell can be improved.

Furthermore, since a difference of switching speeds is reduced and the switching speed is increased, designing of logic circuit can be made easier than the conventional example, and the semiconductor device can be made large-scale much more.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A semiconductor device having an integrated injection logic cell composed of a constant current source transistor and a switch transistor formed on a common semiconductor substrate comprising:

a first semiconductor layer doped with a first conductivity type impurity formed directly on an epitaxial layer of said semiconductor substrate;

a plurality of external base regions formed by diffusion of said first conductivity type impurity of said first semiconductor layer into said epitaxial layer;

a plurality of intrinsic base regions formed between said plurality of external base regions in said epitaxial layer;

a second semiconductor layer doped with a second conductivity type impurity formed directly on said plurality of intrinsic base regions such that said first and second semiconductor layers are electrically isolated from each other;

a plurality of collector electrodes of said switch transistor formed on said second semiconductor layer;

a plurality of collector regions formed by diffusion of impurity from said second semiconductor layer into said corresponding intrinsic base regions; and a base electrode deriving portion formed on said first semiconductor layer.

2. A semiconductor device according to claim 1, wherein said external base region is formed from said base electrode deriving portion to a collector region adjacent to said base electrode deriving portion.

3. A semiconductor device according to claim 1, wherein said first semiconductor layer is a polycrystalline silicon layer.

4. A semiconductor device according to claim 1, wherein said first semiconductor layer is of a laminated structure composed of a polycrystalline silicon layer and a metal layer.

5. A semiconductor device according to claim 2, wherein said first semiconductor layer is a polycrystalline silicon layer.

6. A semiconductor device according to claim 2, wherein said first semiconductor layer is of a laminated structure composed of a polycrystalline silicon layer and a metal layer.

* * * * *